US012068264B2

(12) United States Patent
Zhai (10) Patent No.: US 12,068,264 B2
(45) Date of Patent: Aug. 20, 2024

(54) DISPLAY PANEL AND DISPLAY DEVICE (71) Applicant: Shanghai Tianma Micro-Electronics Co., Ltd., Shanghai (CN)

(72) Inventor: Yingteng Zhai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 372 days.

(21) Appl. No.: 17/446,518

(22) Filed: Aug. 31, 2021

(65) Prior Publication Data

US 2022/0352101 A1 Nov. 3, 2022

(30) Foreign Application Priority Data

Apr. 28, 2021 (CN) .......................... 202110470150.9

(51) Int. Cl.
*H01L 23/60* (2006.01)
*H01L 25/075* (2006.01)
*H01L 27/12* (2006.01)
*H01L 33/58* (2010.01)
*H01L 33/62* (2010.01)

(52) U.S. Cl.
CPC .......... *H01L 23/60* (2013.01); *H01L 25/0753* (2013.01); *H01L 27/1214* (2013.01); *H01L 33/58* (2013.01); *H01L 33/62* (2013.01)

(58) Field of Classification Search
CPC . H01L 23/60; H01L 25/0753; H01L 27/1214; H01L 33/58; H01L 33/62
See application file for complete search history.

(56) References Cited

U.S. PATENT DOCUMENTS

| 11,804,061 B2 * | 10/2023 | He | G06V 40/1318 |
| 2021/0199875 A1 * | 7/2021 | Okahisa | F21V 11/00 |

FOREIGN PATENT DOCUMENTS

| CN | 109343285 A | 2/2019 |
| CN | 111725428 A | 9/2020 |
| CN | 112164690 A | 1/2021 |

OTHER PUBLICATIONS

CN-1274906-A, Murata, Nov. 2000 (Year: 2000).*
CN-106129046-A, Jin, Nov. 2016 (Year: 2016).*
CN-108766994-B, Peng, Mar. 2021 (Year: 2021).*
CN-113079686-A, Li, Jul. 2021 (Year: 2021).*
CN-101630078-A, Huang, Jan. 2010 (Year: 2010).*
CN-101630078-B, Huang, Dec. 2010 (Year: 2010).*
CN-103926739-A, Ding, Jul. 2014 (Year: 2014).*

* cited by examiner

*Primary Examiner* — Mary Ellen Bowman
(74) *Attorney, Agent, or Firm* — Anova Law Group, PLLC (57) ABSTRACT

A display panel includes a first substrate, a second substrate, a light emitting element, and a first conductor. The second substrate is arranged opposite to the first substrate. The light emitting element is located on a side of the first substrate facing towards the second substrate. The first conductor is located on a side of the first substrate facing towards the second substrate.

18 Claims, 10 Drawing Sheets

DISPLAY PANEL AND DISPLAY DEVICE

CROSS-REFERENCE TO RELATED APPLICATION

This application claims the priority to Chinese patent application No. 202110470150.9, filed on Apr. 28, 2021, the entirety of which is incorporated herein by reference.

TECHNICAL FIELD

The present disclosure relates to the technical field of electronic products and, more particularly, to a display panel and a display device.

BACKGROUND

With the advancement of technology, digital display devices such as smart phones and tablet computers have been widely used, and a display panel is an indispensable interpersonal communication interface in these display devices. Often, the display panel generates static electricity when in use, and electrostatic discharge is one of the main factors that cause damages to the display panel.

Therefore, a new display panel and display device are in urgent need.

SUMMARY

In accordance with the disclosure, there is provided a display panel including a first substrate, a second substrate, a light emitting element, and a first conductor. The second substrate is arranged opposite to the first substrate. The light emitting element is located on a side of the first substrate facing towards the second substrate. The first conductor is located on a side of the first substrate facing towards the second substrate.

Also in accordance with the disclosure, there is provided a display device including a display panel. The display panel includes a first substrate, a second substrate, a light emitting element, and a first conductor. The second substrate is arranged opposite to the first substrate. The light emitting element is located on a side of the first substrate facing towards the second substrate. The first conductor is located on a side of the first substrate facing towards the second substrate.

Compared with related technology, a display panel provided by the embodiments of the present disclosure includes a first substrate, a second substrate, and a light emitting element. The second substrate is arranged opposite to the first substrate, and the light emitting element is located on a side of the first substrate facing towards the second substrate. The display panel further includes a first conductor located on a side of the first substrate facing towards the second substrate. By arranging the first conductor on the first substrate, static electricity transmitted from the second substrate can be conducted away from the first conductor, thereby realizing electrostatic discharge inside the display panel. The first conductor may be arranged around the light emitting element to enhance electrostatic discharge effect, which prevents elements on the first substrate from being damaged due to the static electricity, and increases service life of the display panel.

BRIEF DESCRIPTION OF THE DRAWINGS

In order to explain the technical solutions in the embodiments of the present disclosure more clearly, reference is made to the accompanying drawings, which are used in the embodiments of the present disclosure. Obviously, the drawings in the following description are some embodiments of the present disclosure, and other drawings can be obtained from these drawings without any inventive effort for those of ordinary skill in the art.

DETAILED DESCRIPTION OF THE EMBODIMENTS

The features and exemplary embodiments of the present disclosure will be described in detail below. There are many specific details in the following detailed description in order to provide a comprehensive understanding of the present disclosure. However, it is obvious to those skilled in the art that the present disclosure can be implemented without some of these specific details. The following description of the embodiments is only to provide a better understanding of the present disclosure by showing examples of the present disclosure.

It should be noted that relational terms such as first and second are only used herein to distinguish one entity or operation from another entity or operation, and do not necessarily require or imply any such actual relationship or order between these entities or operations. Also, the terms "include," "involve" or any other variations thereof are intended to cover non-exclusive inclusion, so that a process, method, object, or device including a series of elements not only includes those elements, but also includes other elements that are not explicitly listed, or also includes elements inherent to such processes, method, object, or device. Without further restrictions, the element associated with phrase "including . . . " does not exclude the existence of other identical elements in the process, method, object, or device that includes the element.

In order to better understand the present disclosure, a display panel and a display device according to the embodiments of the present disclosure will be described in detail below with reference to FIGS. 1 to 18.

Figure 1:
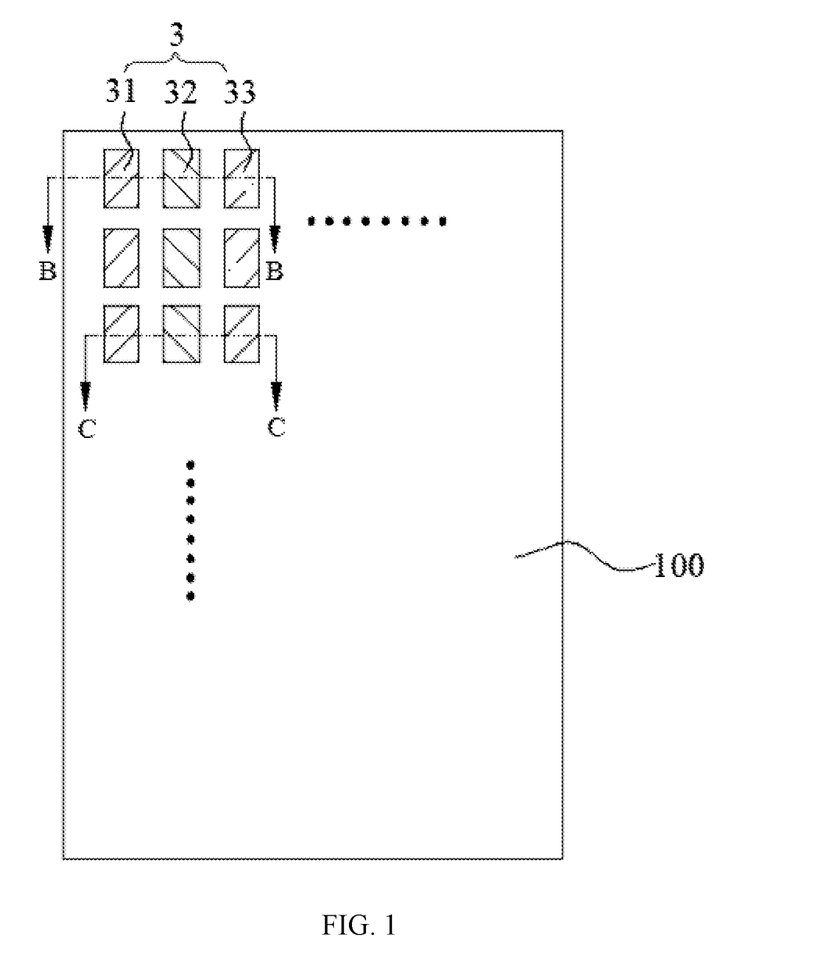
FIG. 1 is a top view of a display panel according to an embodiment of the present disclosure.
Figure 2:
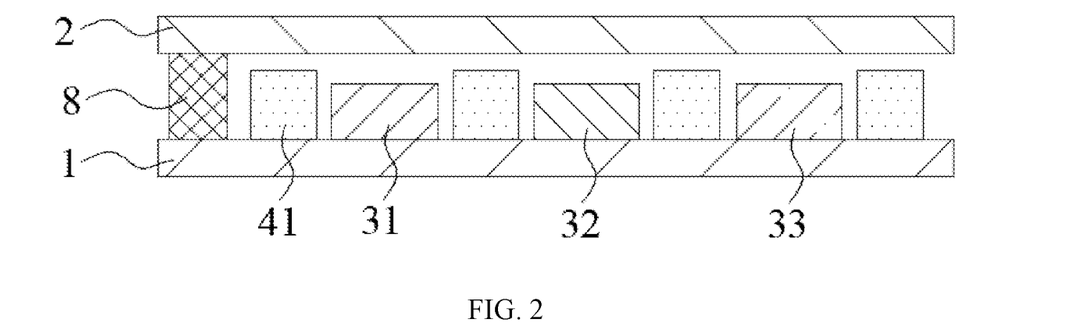
FIG. 2 is a cross-sectional view of a display panel in FIG. 1 along direction B-B.

Referring to FIGS. 1 and 2, the embodiments of the present disclosure provide a display panel 100 including a first substrate 1, a second substrate 2, and light emitting elements 3. The second substrate 2 is arranged opposite to the first substrate 1, and the light emitting elements 3 are located on a side of the first substrate 1 facing towards the second substrate 2. The display panel 100 further includes conductors 4, and the conductors 4 include first conductors 41 located on a side of the first substrate 1 facing towards the second substrate 2. By arranging the first conductors 41 on the first substrate 1, static electricity transmitted from the second substrate 2 can be conducted away from the first conductors 41, thereby realizing electrostatic discharge inside the display panel. The first conductors 41 may be arranged around the light emitting elements 3 to enhance electrostatic discharge effect, which prevents the elements on the first substrate 1 from being damaged due to the static electricity, and increases service life of the display panel.

It should be noted that, referring to FIG. 2, a frame area of the display panel 100 is provided with a frame sealant 8. The conductors 4 can be arranged in a display area of the display panel 100, or can be arranged in the frame area of the display panel 100, but the conductors 4 need to be on an inner side of the frame sealant 8. In order to prevent the static electricity from hitting the light emitting elements 3, the first conductors 41 need to be closer to the second substrate 2 than the light emitting elements 3, so that the static electricity from the second substrate 2 can hit the first conductors 41 first, and then be conducted away via the first conductors 41, thereby realizing the electrostatic discharge of the display panel.

A preparation process of a display panel according to the embodiments of the present disclosure includes: providing the first substrate (S11); transferring the light emitting elements to the first substrate (S12); forming patterned first conductors around the light emitting elements on the first substrate (S13); providing the second substrate facing towards the first conductors and attaching to the first substrate (S14).

It can be understood that in step S13, when the first conductors 41 are formed by patterning around the light emitting elements 3, etching and other processes are involved, which tend to cause damage to the light emitting elements 3. So, in step S13, it is needed to ensure that the light emitting elements 3 are not damaged at the same time, which increases the difficulty of preparing the display panel. If the first conductors 41 are first prepared on the first substrate 1 and then the light emitting elements 3 are prepared, since the first conductors 41 are more convex than the light emitting elements 3, they will hinder the transfer process of the light emitting elements 3, so that production efficiency of the display panel is affected.

Figure 3:
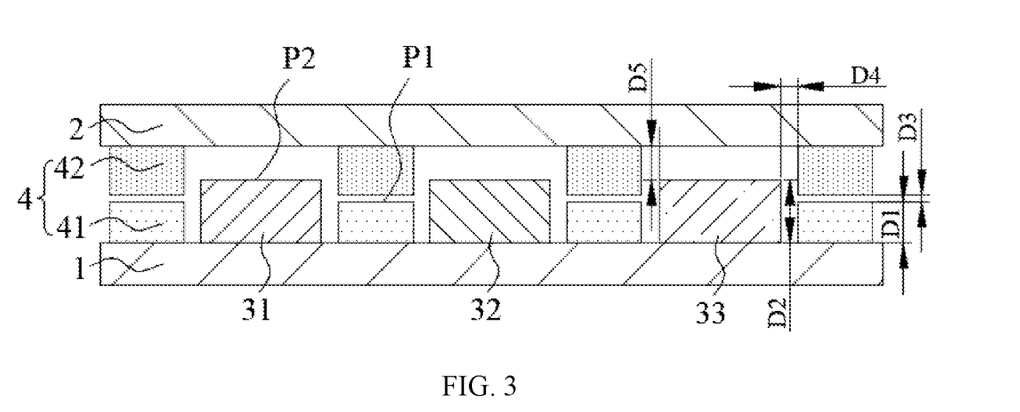
FIG. 3 is a cross-sectional view of another display panel in FIG. 1 along direction C-C.

Referring to FIG. 3, in order to reduce the difficulty of manufacturing process of the display panel, the embodiments of the present disclosure provide a display panel 100. The display panel 100 includes second conductors 42 located on a side of the second substrate 2 facing towards the first substrate 1, and the first conductors 41 and the second conductors 42 overlap. By dividing the conductors 4 into the first conductors 41 on the first substrate 1 and the second conductors 42 on the second substrate 2, minimum distance from a surface of the first conductor 41 in contact with the first substrate 1 to a surface of the first conductor 41 facing away from the first substrate 1 is reduced, so that production interference of the light emitting elements 3 and the first conductors 41 can be avoided when the light emitting elements 3 are transferred to the first substrate 1 after the first conductors 41 are fabricated on the first substrate 1, which reduces manufacturing difficulty of the conductors 4 on the first substrate 1. In addition, since the first conductors 41 and the second conductors 42 overlap, that is, projection of the first conductors 41 on the first substrate 1 and projection of the second conductors 42 on the first substrate 1 at least partially overlap, in order to form an electrostatic discharge path that sequentially passes through the second substrate 2, the second conductors 42, and the first conductors 41. In addition, by providing the second conductors 42, the static electricity generated by the second substrate 2 can be transmitted to the first conductors 41 through the second conductors 42, so that transmission path is shorter, and efficiency of conduction from the second substrate 2 to the first conductors 41 is improved, which can realize a quick electrostatic discharge inside the display panel 100, prevent the elements of the display panel 100 from being damaged due to the static electricity, and increase service life of the display pane 100.

Figure 4:
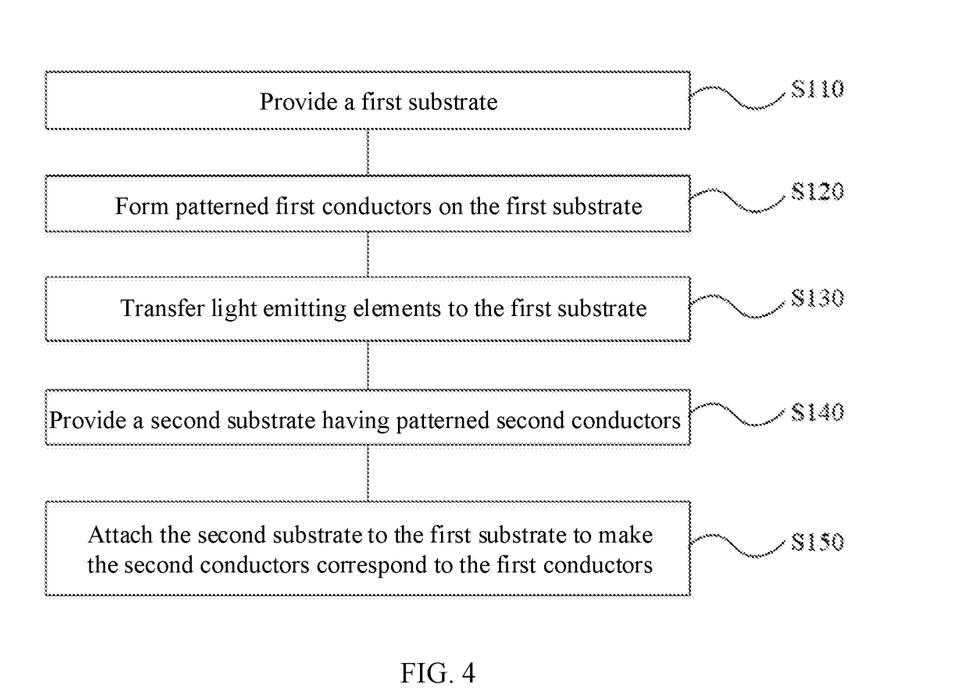
FIG. 4 is a preparation flow chart of another display panel according to an embodiment of the present disclosure.

Referring to FIG. 4, a preparation process of a display panel according to the embodiments of the present disclosure includes: providing the first substrate (S110); forming patterned first conductors on the first substrate (S120); transferring the light emitting elements to the first substrate (S130); providing the second substrate having patterned second conductors (S140); attaching the second substrate to the first substrate to make the second conductors correspond to the first conductors (S150).

It can be understood that since the conductors 4 are divided into the first conductors 41 on the first substrate 1 and the second conductors 42 on the second substrate 2, the surface of the first conductor 41 facing away from the first substrate 1 can be closer to the first substrate 1 than a surface of the light emitting element 3 facing away from the first substrate 1. Therefore, the first conductors 41 will not hinder the transfer process of the light emitting elements 3, that is, the first conductors 41 can be first formed on the first substrate 1 in step S120, and then the light emitting elements 3 can be transferred to the first substrate 1 in step S130, which reduces the difficulty of preparing the display panel. Meanwhile, the conductors 4 are separately arranged on the first substrate 1 and the second substrate 2, so that thickness of the first conductors 41 and the second conductors 42 in the conductors 4 are reduced, which reduces process difficulty of preparing the conductors 4.

The first substrate 1 is a light emitting array substrate, and the second substrate 2 is a cover plate, which is a film layer made of a material such as glass with high light transmittance to protect the display panel 100. Specifically, the cover plate can be made of a rigid material with relatively low cost, and can also be made of a flexible material, so that the cover plate can be folded, which can be applied to flexible and foldable display modules. For example, the second substrate 2 can be made of transparent, soft, and foldable materials such as UTG (Ultra Thin Glass), CPI (Colorless Polyimide), PET (Polyethylene Terephthalate), etc., so as to realize bendable folding of the cover plate, which is convenient to be applied to a foldable display device. The first conductors 41 and the second conductors 42 are ESD (Electro-Static Discharge) metals.

In order to realize color display, the display panel 100 may be configured as: the light emitting elements 3 on the first substrate 1 are light emitting elements 3 of the same color, for example, blue light emitting elements; the second substrate 2 may include film layers such as a color conversion layer and a color filter layer to cooperate with the light emitting elements 3 to realize color display. Or, the display panel 100 may be configured as: the light emitting elements 3 on the first substrate 1 include a red light emitting element, a green light emitting element, and a blue light emitting element, and the light emitting elements of three colors cooperate to realize color display. The second substrate 2 may include a color filter layer to improve color purity of light emitted by the light emitting elements of each color.

Figure 5:
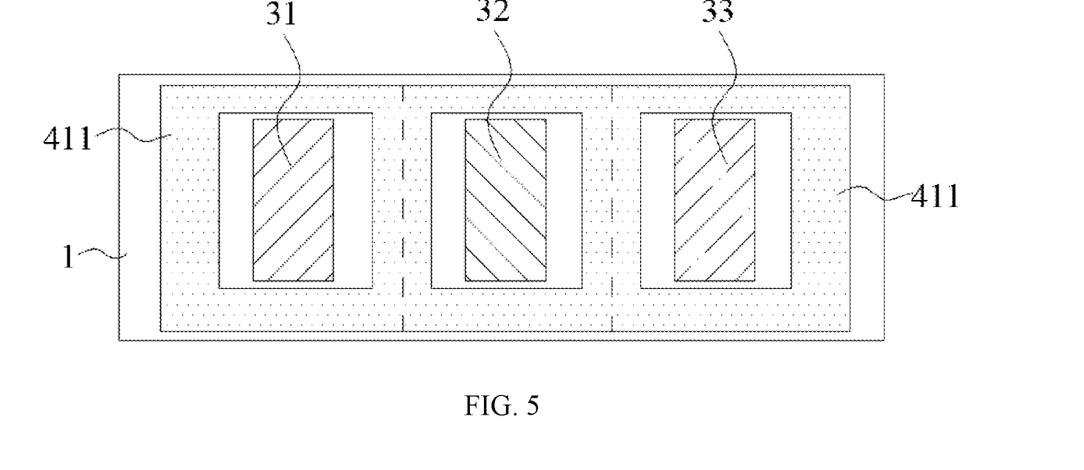
FIG. 5 is a plan view showing a first conductor and a light emitting element of a display panel being projected on a first substrate according to an embodiment of the present disclosure.
Figure 6:
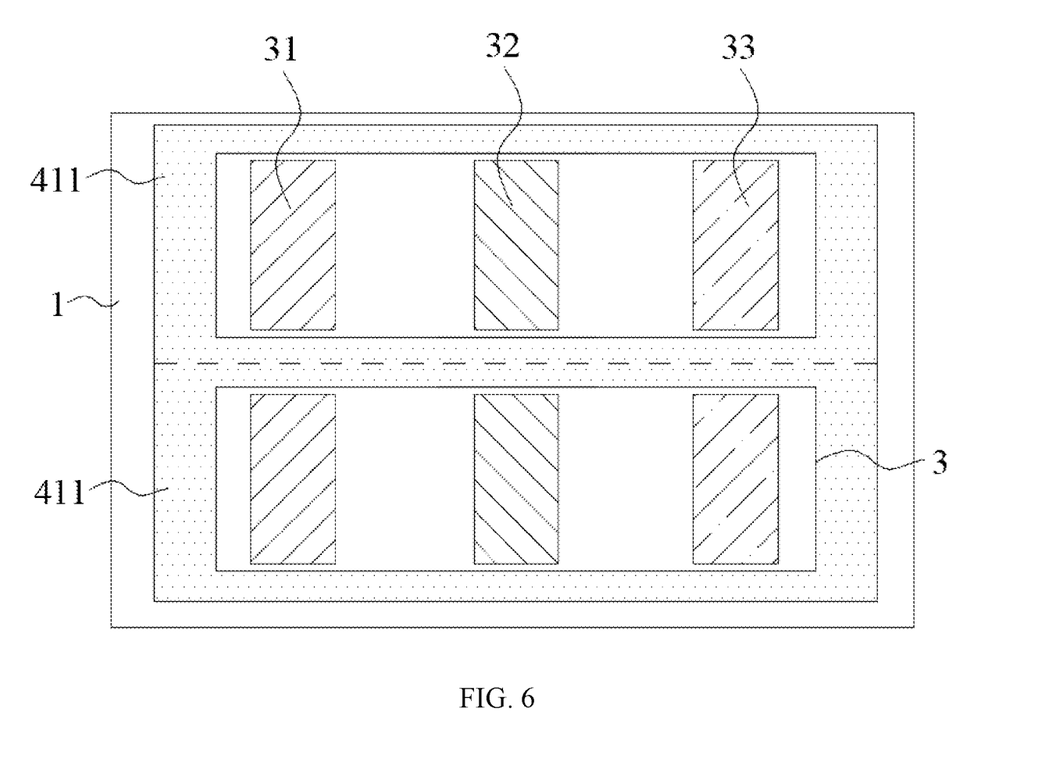
FIG. 6 is a plan view showing a first conductor and a light emitting element of another display panel being projected on a first substrate according to an embodiment of the present disclosure.

Referring to FIGS. 5 and 6, in the display panel 100 according to the embodiment of the present disclosure, the first conductors 41 include first members 411 distributed annularly along outer peripheral sides of the light emitting elements 3, that is, the first conductors 41 are continuously distributed around the light emitting elements 3, On one hand, by increasing areas of the first conductors 41, the static electricity generated by the display panel 100 during use can be quickly conducted away, reducing risk of static electricity accumulation and thereby protecting the first substrate 1. On the other hand, since the first conductors 41 are distributed around various light emitting elements 3, the static electricity transmitted from the second substrate 2 will be directly conducted away by adjacent first conductors 41, and will not be conducted to the light emitting elements 3, so as to protect the light emitting elements 3.

Further, the number of the light emitting elements 3 is multiple, which are electrically connected to multiple first members 411 included in the first conductors 41. The light emitting elements 3 include a first light emitting element 31, a second light emitting element 32, and a third light emitting element 33 that are distributed in an array and constitute a pixel. Referring to FIG. 5, the multiple first members 411 may be respectively arranged around the first light emitting element 31, the second light emitting element 32, and the third light emitting element 33. The multiple first members 411 are electrically connected to each other, so that electrostatic discharge around the multiple light emitting elements 3 can be achieved. In addition, referring to FIG. 6, one first member 411 can also be arranged around the first light emitting element 31, the second light emitting element 32, and the third light emitting element 33 at the same time. Since the first members 411 are electrically connected to each other, when the static electricity is generated around any light emitting element 3 during use, it can be conducted away from adjacent first member 411, so as to prevent the various light emitting elements 3 from being damaged due to the static electricity, and increase service life of the display pane 100.

It can be understood that colors of the first light emitting element 31, the second light emitting element 32, and the third light emitting element 33 can each be one of three colors of red, green, and blue. According to light color mixing principle, the number and position of each light emitting element can be reasonably configured to realize the color display of the display panel.

Figure 7:
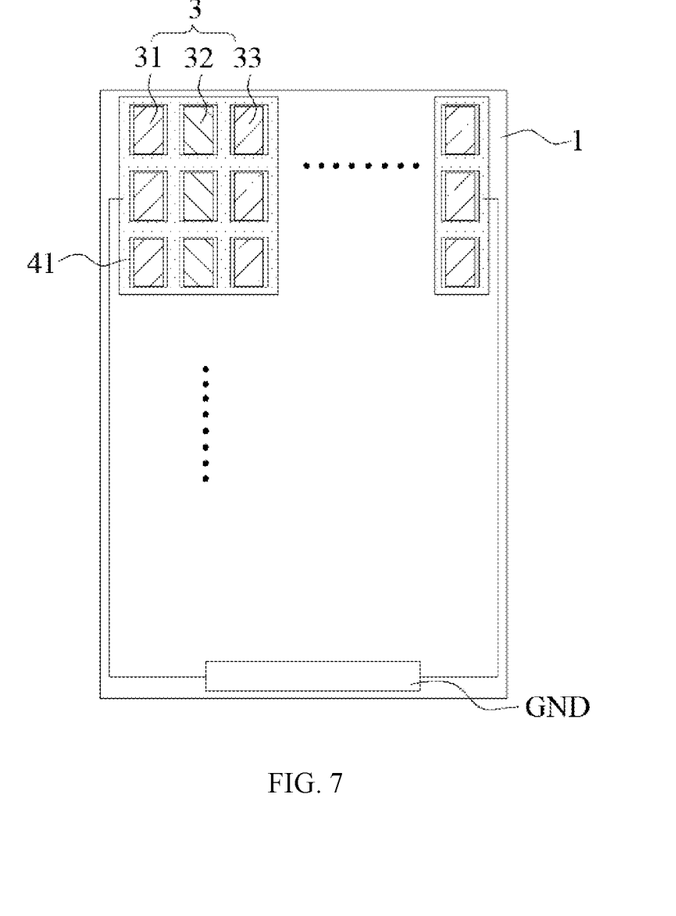
FIG. 7 is a top view of a first substrate and a light emitting element according to an embodiment of the present disclosure.

Referring to FIG. 7, in order to realize the electrostatic discharge inside the display panel 100 through the first conductors 41, the first conductors 41 are grounded. Specifically, the first conductors 41 can transmit the static electricity in the display panel 100 to a ground terminal GND, so as to prevent the static electricity from damaging the light emitting elements 3 or driving devices on the first substrate 1. It should be noted that the figures only illustrate relative positional relationship among components, and the dimensions in the figures are not the actual dimensions of the components and should not be regarded as limitations to the embodiments of the present disclosure.

Figure 8:
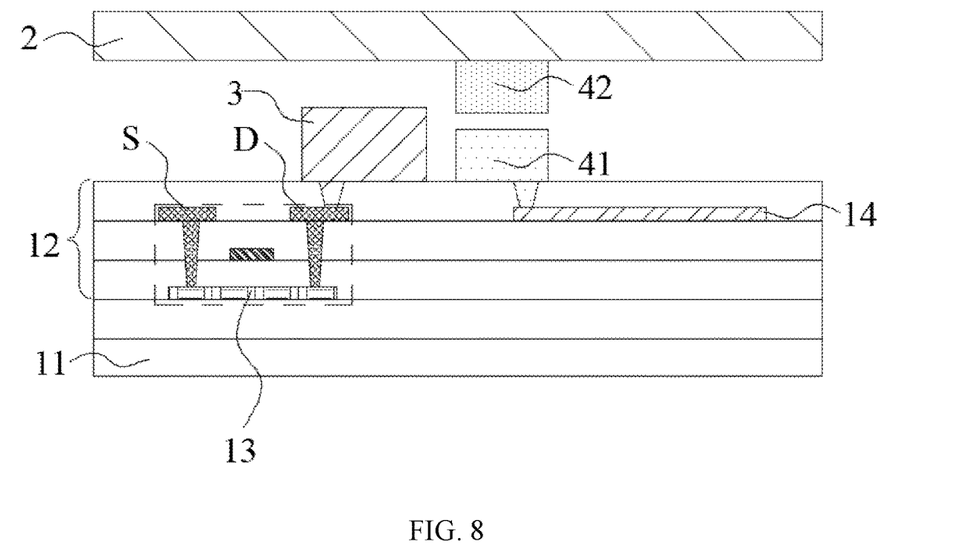
FIG. 8 is a cross-sectional view of another display panel according to an embodiment of the present disclosure.

Referring to FIG. 8, specifically, in the display panel 100 provided in the embodiments of the present disclosure, the first substrate 1 includes a base substrate 11 and transistor array layers 12 on a side of the base substrate 11 and located between the base substrate 11 and the light emitting elements 3. Specifically, the first substrate 1 is provided with a plurality of pixel units that include the transistor array layers 12 and the light emitting elements 3. The transistor array layers 12 are provided with a plurality of pixel circuits 13 corresponding to the plurality of pixel units. The pixel circuits 13 drive the light emitting elements 3, and the light emitting elements 3 are connected to the pixel circuits 13 to achieve light emission. The first conductors 41 are connected to a first circuit 14, and the first circuit 14 may specifically be a grounded circuit. An electrostatic discharge path is formed between the first conductors 41 and the first circuit 14, and the static electricity inside the display panel 100 is discharged through the electrostatic discharge path, so as to prevent the static electricity from damaging the transistor array layers 12 and the light emitting elements 3.

Further, the pixel circuit 13 includes a plurality of thin film transistors. The thin film transistor includes a gate, a source S, and a drain D, and materials of the drain D, the source S and the gate may include one or a combination of molybdenum, titanium, aluminum, copper, etc. The gate of the thin film transistor is usually configured to receive a control signal, so that the thin film transistor is turned on or off under the control of the control signal. Type of the thin film transistor may be a P-type transistor or an N-type transistor.

Referring to FIG. 3, in order to further ensure the preparation of the conductors 4 and the realization of the electrostatic discharge in the embodiments of the present disclosure, that is, on one hand, to ensure that the first conductors 41 do not interfere with the manufacture of the light emitting elements 3, and on the other hand, to ensure that the static electricity is conducted away from the first conductors 41. The first conductor 41 includes a first surface P1 facing towards the second substrate 2, the light emitting element 3 includes a second surface P2 facing towards the second substrate 2, and distance between the first surface P1 and the first substrate 1 is smaller than distance between the second surface P2 and the first substrate 1. That is, in the structure of the display panel, an upper surface of the first conductor 41 is lower than an upper surface of the light emitting element 3, and reference can be made to the arrangement of the display panel in FIG. 3 (i.e., the second substrate 2 is located above the first substrate 1).

In a case where a surface of the first substrate 1 in contact with the first conductors 41 and the light emitting elements 3 is a flat surface, the technical solution described above can be understood as that thickness of the first conductor 41 is smaller than thickness of the light emitting element 3.

When the surface of the first substrate 1 in contact with the first conductors 41 and the light emitting elements 3 is an uneven surface, on one hand, a surface of the first substrate 1 facing away from the first conductors 41 and the light emitting elements 3, i.e., a lower surface of the first substrate 1, is generally a flat surface, so the technical solution described above can be understood as that distance between the first surface P1 and the lower surface of the first substrate 1 is smaller than distance between the second surface P2 and the lower surface of the first substrate 1. On the other hand, it can also be understood as that the distance between the first surface P1 and the first substrate 1 is the minimum distance from the surface of the first conductor 41 in contact with the first substrate 1 to the surface of the first conductor 41 facing away from the first substrate 1, and the distance between the second surface P2 and the first substrate 1 is the minimum distance from the surface of the light emitting element 3 in contact with the first substrate 1 to the surface of the light emitting element 3 facing away from the first substrate 1.

Therefore, for ease of description, in the embodiments of the present disclosure, the distance between the first surface P1 and the first substrate 1 is defined as a first distance D1, and the distance between the second surface P2 and the first substrate 1 is defined as a second distance D2. Since the first distance D1 is smaller than the second distance D2, when the light emitting elements 3 are transferred to the surface of the first substrate 1, the first conductors 41 will not affect transferring and fixing of the light emitting elements 3, which thereby avoids interference between the production of the first conductors 41 and the light emitting elements 3. As a result, a conventional process of those skilled in the art can be used when the first conductors 41 are fabricated on the first substrate 1, which is not specifically limited herein. For example, the first distance D1 is 0.1 μm to 10 μm, and the second distance D2 is 2 μm to 100 μm. Actual sizes of the first distance D1 and the second distance D2 can be determined according to the arrangement structure of the light emitting elements 3 on the first substrate 1, as long as that the first distance D1 is smaller than the second distance D2 can be ensured.

Further, in order to ensure that static electricity can be conducted away from the first conductors 41, referring to FIG. 3, distance between the first conductor 41 and the second conductor 42 is smaller than distance between the light emitting element 3 and the second substrate 2. For ease of description, a minimum distance between the first conductor 41 and the second conductor 42 in vertical direction is defined as a third distance D3, a minimum distance between the first conductor 41 and the second conductor 42 in horizontal direction is defined as a fourth distance D4, and a minimum distance between the light emitting element 3 and the second substrate 2 is defined as a fifth distance D5. In order to prevent the static electricity on the second substrate 2 from being discharged from the light emitting elements 3, on one hand, it is needed to ensure that static electricity does not directly hit the light emitting elements 3 from the second substrate 2, that is, the third distance D3 needs to be smaller than the fifth distance D5. On the other hand, it is needed to satisfy that the static electricity conducted from the second substrate 2 to the second conductors 42 does not be discharged from the light emitting elements 3, that is, the third distance D3 needs to be smaller than the fourth distance D4. By ensuring that the static electricity conducted from the second substrate 2 can first hit the first conductors 41 through the second conductors 42, and then be discharged by the electrostatic discharge path, it prevents the static electricity from damaging the light emitting elements 3 and the driving devices on the first substrate 1.

Figure 9:
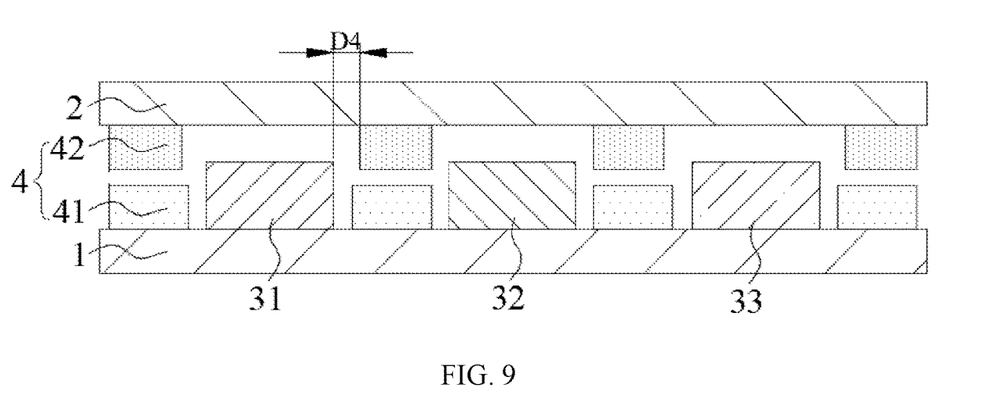
FIG. 9 is a cross-sectional view of another display panel in FIG. 1 along direction C-C.

Referring to FIGS. 3 and 9, because an electric field strength between the first conductor 41 and the second conductor 42 is greater than a dielectric strength of medium, even if the first conductor 41 and the second conductor 42 partially overlap, it is still ensured that the static electricity can be transferred from the second conductor 42 to the first conductor 41. FIG. 3 shows a case where the first conductor 41 and the second conductor 42 completely overlap, and FIG. 9 shows a case where the first conductor 41 and the second conductor 42 partially overlap. When a projection of the first conductor 41 on the light emitting array substrate and a projection of the second conductor 42 on the light emitting array substrate at least partially overlap, electrostatic charge transferred from direction of the cover plate can be conducted from the second conductor 42 to the first conductor 41, thereby realizing the electrostatic discharge inside the display pane 100.

It should be noted that when the second conductor 42 and the first conductor 41 partially overlap, distance between the second conductor 42 and the light emitting element 3 in horizontal direction changes. Since the static electricity is more likely to be discharged from a closer path, when a width of the second conductor 42 is greater than a width of the first conductor 41, the distance between the second conductor 42 and the light emitting element 3 is likely to be closer, so that the static electricity is discharged from the second conductor 42 along the light emitting element 3. Therefore, the width of the second conductor 42 can be made smaller than the width of the first conductor 41, so as to ensure that the fourth distance D4 is greater than the third distance D3.

For example, the third distance D3 is 0 μm to 1 μm, and the fourth distance D4 is 1 μm to 2 μm. That is, when a difference between the second distance D2 and the first distance D1 is relatively large, a minimum distance from a surface of the second conductor 42 in contact with the second substrate 2 to a surface of the second conductor 42 facing away from the second substrate 2 can be increased to adjust a difference between the third distance D3 and the fourth distance D4, so as to ensure that the third distance D3 is smaller than the fourth distance D4. The third distance D3 is 0 μm to 1 μm includes two cases, where the third distance D3 is greater than 0 μm and the third distance is equal to 0 μm. Referring to FIG. 3, the distance between the first conductor 41 and the second conductor 42 is greater than zero, i.e., the third distance D3 is greater than 0 μm, which avoids issues such as collision between the first conductor 41 and the second conductor 42 due to process errors.

Figure 10:
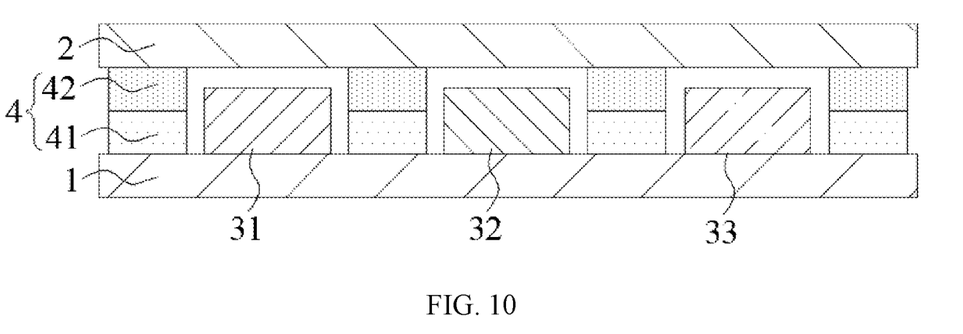
FIG. 10 is a cross-sectional view of another display panel in FIG. 1 along direction C-C.

In some embodiments, referring to FIG. 10, the first conductor 41 is in contact with the second conductor 42, i.e., the third distance D3 is equal to 0 μm. It should be noted that the third distance equal to 0 μm here does not mean that the first conductor 41 and the second conductor 42 are integrally manufactured, but that after the first conductor 41 is fabricated on the first substrate 1 and the second conductor 42 is fabricated on the second substrate, respectively, there is no gap between the first conductor 41 and the second conductor 42 when the second substrate 2 is attached to the first substrate 1. When the third distance D3 is equal to 0 μm, the static electricity on the second substrate 2 can be quickly conducted to the first conductor 41 via the second conductor 42, which prevents static electricity accumulation and improves electrostatic protection effect.

Figure 11:
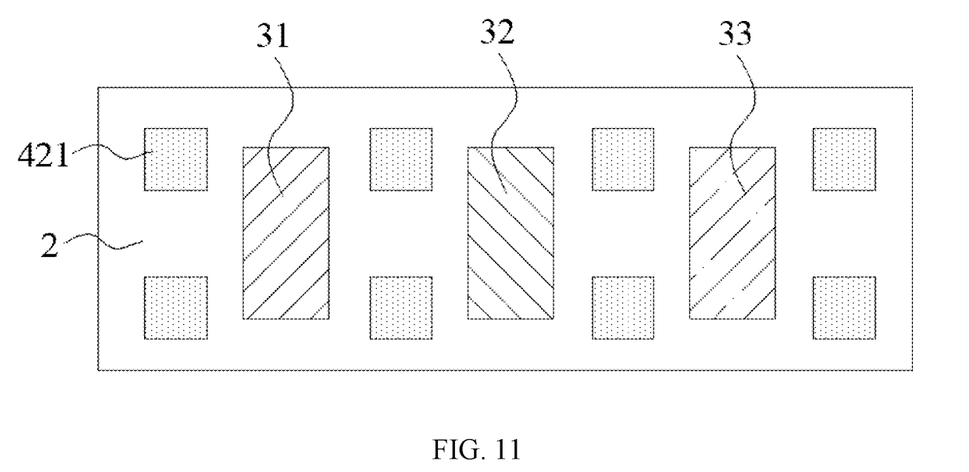
FIG. 11 is a plan view showing a second conductor and a light emitting element of a display panel being projected on a second substrate according to an embodiment of the present disclosure.
Figure 12:
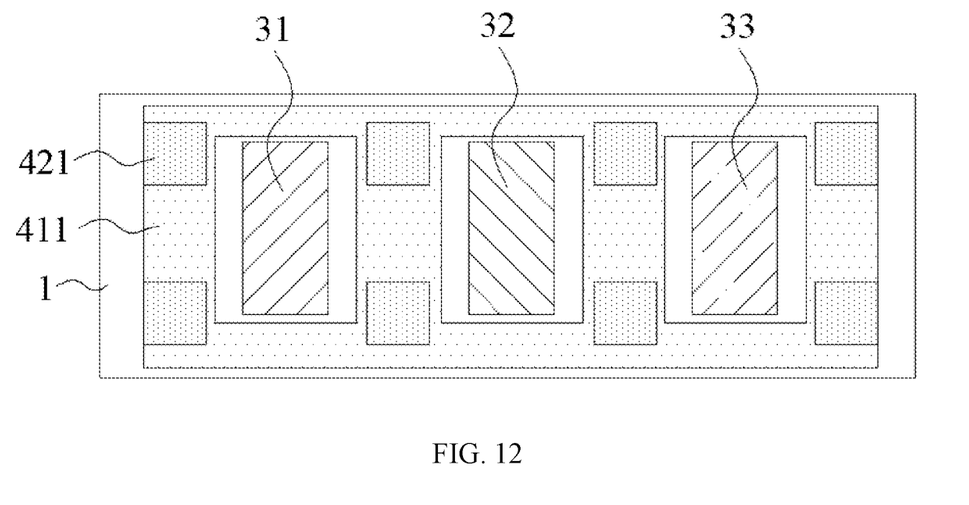
FIG. 12 is a plan view showing a second conductor of another display panel being projected on a first substrate provided with a first conductor and a light emitting element according to an embodiment of the present disclosure.

Corresponding to the first conductors 41 on the first substrate 1, referring to FIGS. 11 and 12, the second conductors 42 include a plurality of discretely arranged sub-members 421, that is, the sub-members 421 are spaced apart on the second substrate 2, and projection of the second conductors 42 on the first substrate 1 is within a coverage of projection of the first conductors 41 on the first substrate 1. By discretely arranging the sub-members 421 on the second substrate 2, the second substrate 2 is prevented from accumulating a large amount of static electricity during the manufacturing process, thereby preventing a large amount of static electricity from damaging devices on the first substrate 1 when the second substrate 2 is attached to the first substrate 1.

FIG. 11 shows a case where the second conductor 42 and the first conductor 41 partially overlap, which can satisfy that the projection of the second conductors 42 on the first substrate 1 is within the coverage of the projection of the first conductors 41 on the first substrate 1, so as to realize the electrostatic discharge of the first substrate 1.

It can be understood that the projection of the second conductors 42 on the first substrate 1 can also be a continuous ring around the light emitting elements 3, that is, the projection of the second conductors 42 on the first substrate 1 and the projection of the first conductors 41 on the first substrate 1 overlap, so as to improve the production efficiency of the display panel 100. By increasing projection areas of the first conductors 41 and the second conductors 42 on the first substrate 1, even if the second substrate 2 accumulates static electricity during the manufacturing process, it can be conducted away through the electrostatic discharge path. Considering that the second conductors 42 are arranged as the plurality of discrete sub-members 421 to achieve the electrostatic discharge and save costs, the following description is still made with a case where the sub-members 421 are discretely arranged on the second substrate 2.

Specifically, referring to FIG. 11, the second conductor 42 includes a sub-member group. The sub-member group includes at least two sub-members 421, and projection of the sub-member group on the first substrate 1 is located around at least one light emitting element 3. The number of the light emitting elements 3 is multiple, and the light emitting elements 3 include the first light emitting element 31, the second light emitting element 32, and the third light emitting element 33, around each of which are provided with the sub-member group. Since the sub-member group includes at least two sub-members 421, it is ensured that the sub-members 421 are provided at all intervals between adjacent light emitting elements 3. Therefore, when the static electricity accumulates around any one of the first light emitting element 31, the second light emitting element 32, and the third light emitting element 33, nearby static electricity can be conducted to the first conductors 41 through adjacent sub-members 421, thereby ensuring that the static electricity around the light emitting elements 3 can all be discharged in time, so as to improve safety. However, in actual use of the display panel 100, there is no case where a large amount of static electricity accumulates at the first light emitting element 31, the second light emitting element 32, and the third light emitting element 33 at the same time. Therefore, by reducing arrangement of the sub-members 421 and increasing utilization rate of the sub-members 421, wiring complexity in the display panel 100 can be reduced.

Figure 13:
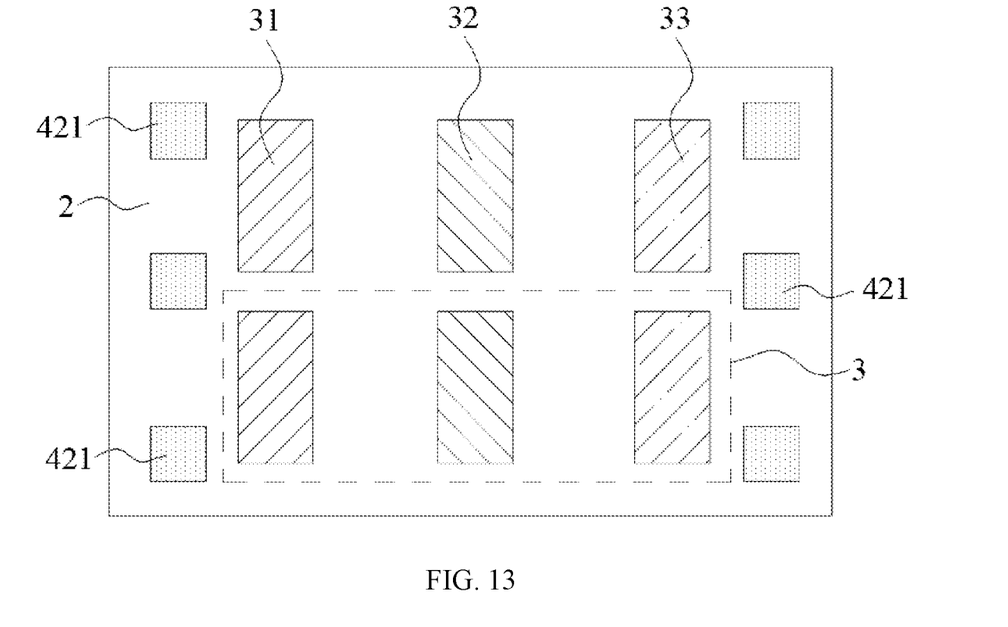
FIG. 13 is a plan view showing a second conductor and a light emitting element of another display panel being projected on a second substrate according to an embodiment of the present disclosure.

In order to further reduce the number of sub-members 421 to increase the utilization rate, referring to FIG. 13, the projection of the sub-member group on the first substrate 1 is located around at least two light emitting elements 3, that is, the sub-member group is arranged around periphery of the plurality of the light emitting elements 3. Specifically, at least two of the first light emitting element 31, the second light emitting element 32, and the third light emitting element 33 are provided with the sub-member group around, for example, the sub-members 421 are provided around the first light emitting element 31 and the third light emitting element 33. At this time, the first light emitting element 31, the second light emitting element 32, and the third light emitting element 33 arranged according to a predetermined track can be regarded as a light emitting group. The light emitting group includes at least two light emitting elements 3, and the sub-member groups are arranged at intervals on the second substrate 2 around various light emitting groups, so that when the static electricity accumulates in the light emitting group, the static electricity can be conducted away from the nearest sub-member 421 in the sub-member group.

Considering that the light emitting elements 3 and the sub-members 421 are discretely provided on the second substrate 2, in order to facilitate the arrangement of the light emitting elements 3 and the sub-members 421 to achieve a better electrostatic discharge effect, the sub-members 421 in the sub-member group are arranged symmetrically, which facilitates a repeated arrangement of the sub-members 421 around the light emitting elements 3 on one hand, and also facilitates the electrostatic discharge around the light emitting elements 3 from the nearest sub-member 421 to reduce the wiring complexity on the other hand.

In some embodiments, the projection of the second conductors 42 on the first substrate 1 is symmetrically distributed about center of the light emitting elements 3, that is, the projection of the second conductors 42 on the first substrate 1 is symmetrically distributed about center of the first light emitting element 31, the projection of the second conductors 42 on the first substrate 1 is symmetrically distributed about center of the second light emitting element 32, and the projection of the second conductors 42 on the first substrate 1 is symmetrically distributed about center of the third light emitting elements 33. By distributing the sub-members 421 at intervals around the light emitting elements 3 in a center-symmetrical manner, the plurality of the light emitting elements 3 share their adjacent sub-members 421, so as to improve the utilization rate of the sub-members 421. Therefore, the number and arrangement of the sub-members 421 can be adjusted according to usage requirements of the display panel 100, which is not specifically limited herein.

Figure 14:
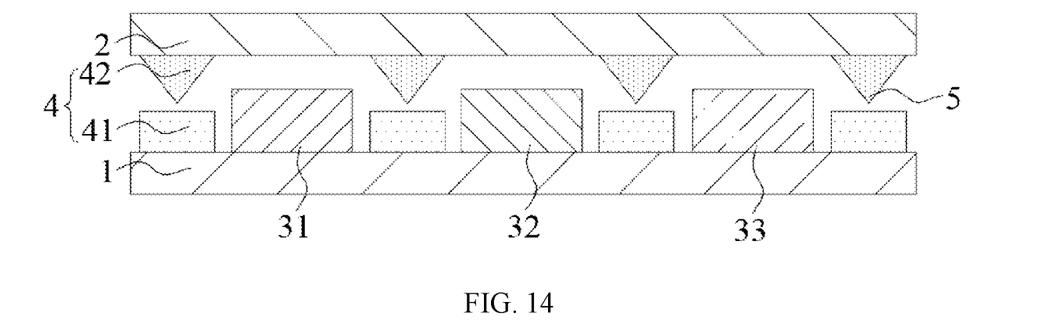
FIG. 14 is a cross-sectional view of another display panel in FIG. 1 along direction C-C.

Referring to FIG. 14, in order to further improve the electrostatic discharge capability of the second conductor 42, in some embodiments, the second conductor 42 includes a tip end 5 facing towards the first substrate 1. The tip end 5 is a tapered shape of the second conductor 42 that tapers toward the direction of the first conductor 41. Curvature at the tip end 5 is large and power lines are dense, so that potential gradient is large, which makes nearby medium easy to be hit that causes tip discharge. By arranging an end of the second conductor 42 facing the first conductor 41 as the tip end 5, the static electricity on the second substrate 2 is easier to be transferred to the first conductor 41 via the tip end 5 of the second conductor 42, which improves the electrostatic discharge effect. For example, the tip end 5 has a conical shape or a pyramid shape.

For example, in a direction perpendicular to a plane where the first substrate 1 is located, cross sections of the first conductor 41 and the second conductor 42 include at least one of a polygonal shape or a semicircular shape. By adjusting cross-sectional shapes of the first conductor 41 and the second conductor 42, the minimum distance between the first conductor 41 and the second conductor 42 can be reduced. Meanwhile, tip discharge effect can be formed at corners of the first conductor 41 and the second conductor 42, which improves electrostatic discharge efficiency. The cross sections of the first conductor 41 and the second conductor 42 can be set to at least one of a polygonal shape or a semicircular shape, or any one of the first conductor 41 and the second conductor 42 can be set to the polygonal shape and the other is set to the semicircular shape. The specific shapes of the first conductor 41 and the second conductor 42 can be adjusted according to actual needs, as long as the tip discharge can be achieved to improve the electrostatic discharge effect, and is not specifically limited herein.

Figure 15:
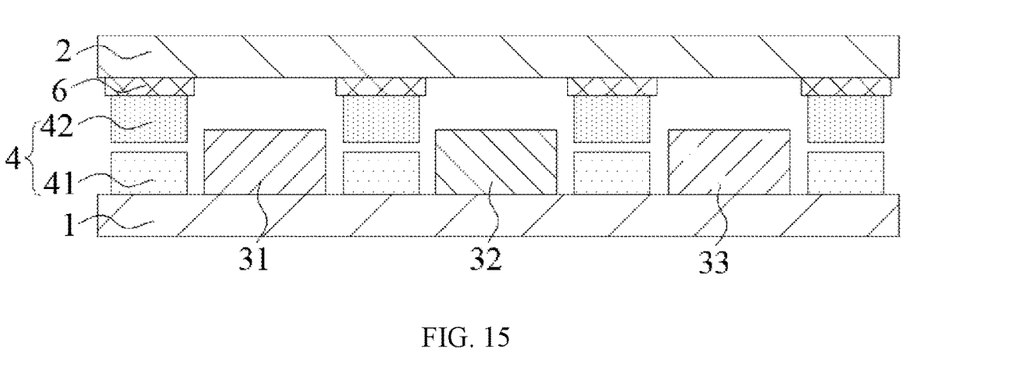
FIG. 15 is a cross-sectional view of another display panel in FIG. 1 along direction C-C.

Referring to FIG. 15, in addition, considering that the production of the conductors 4 will affect the display effect of the display panel 100, in order to prevent the conductors 4 from being visible, the display panel 100 also includes black matrix layers 6. The black matrix layer is located between the second substrate 2 and the second conductor 42, and the black matrix layer 6 and the second conductor 42 overlap, that is, projection of the black matrix layer 6 on the first substrate 1 and projection of the second conductor 42 on the first substrate 1 at least partially overlap. The conductors 4 are blocked by the black matrix layer 6, which prevents the conductors 4 from reflecting light, so that emissivity is reduced and the conductors 4 are prevented from being visible. In order to further improve the display effect, the projection of the black matrix layer 6 on the first substrate 1 can cover the projection of the second conductor 42 on the first substrate 1, so as to ensure that the conductors 4 are invisible during display.

Materials of the black matrix layer 6 include black conductive materials, such as carbon-containing resin materials. The electrostatic discharge path of the display panel 100 is the second substrate 2, the black matrix layer 6, the second conductor 42, and the first conductor 41, and the materials of the black matrix layer 6 is set to include the black conductive materials, so that a complete electrostatic discharge path is formed between the second substrate and the first substrate. Materials of the first conductor 41 include metals, and materials of the second conductor 42 include metals or the black conductive materials.

Figure 16:
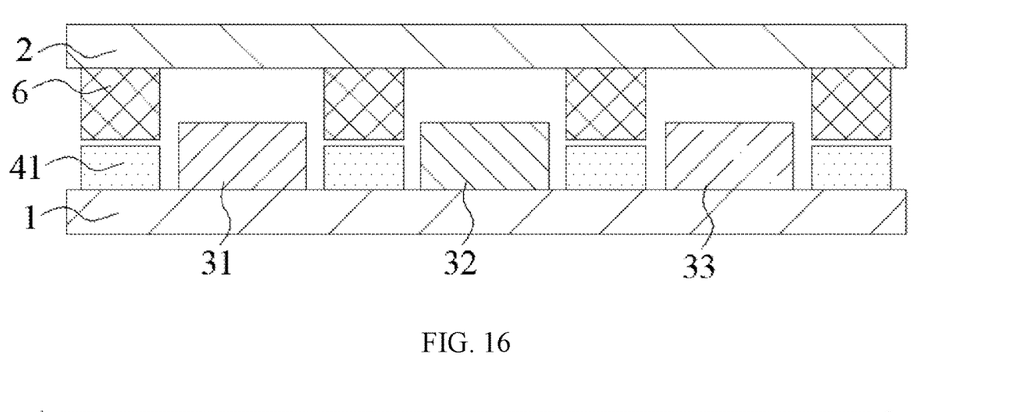
FIG. 16 is a cross-sectional view of another display panel in FIG. 1 along direction C-C.

In some embodiments, referring to FIG. 16, the second conductor 42 can reuse the black matrix layer 6, that is, the second conductor 42 and the black matrix layer 6 are integrally made of black conductive materials, which simplifies the manufacturing process of the display panel 100, and can also ensure that the conductors 4 are blocked by the black matrix layer 6 and are invisible, so that the display effect of the display panel 100 is ensured.

Figure 17:
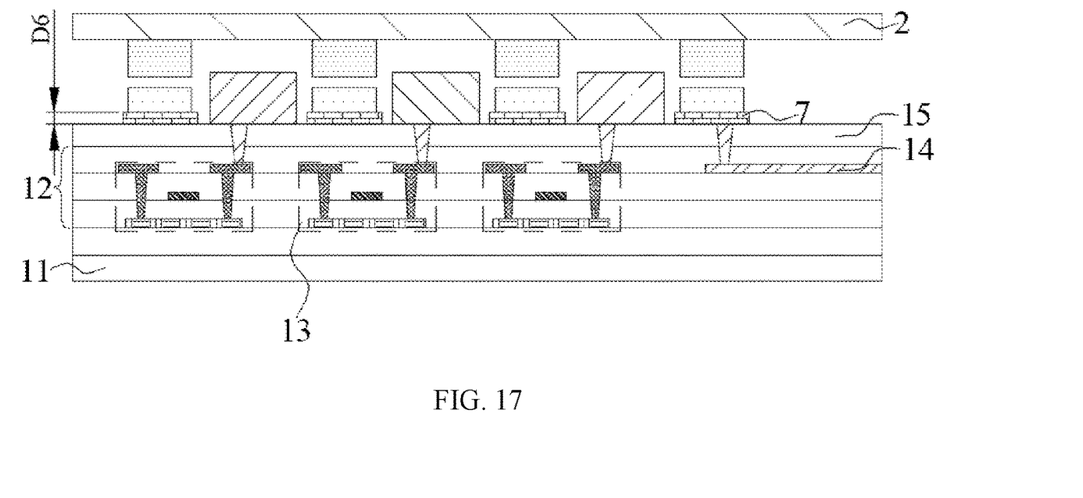
FIG. 17 is a cross-sectional view of another display panel in FIG. 1 along direction C-C.

Referring to FIG. 17, in order to ensure luminescence of the light emitting elements 3 and improve the display effect of the display panel 100, the display panel 100 also includes blocking members 7. The blocking members 7 are located between the first substrate 1 and the first conductors 41, and are located between adjacent light emitting elements 3. The blocking members 7 between the adjacent light emitting elements 3 can block some light emitting angles of the light emitting elements 3, which prevents the light emitted by the light emitting elements 3 from emitting from another pixel position and thus avoids light mixing. For example, materials of the blocking member 7 include molybdenum, titanium, aluminum, and titanium-aluminum-titanium composite metal materials.

Specifically, the first substrate 1 also includes a planarization layer 15, which covers a side of the transistor array layers 12 away from the base substrate 11. The blocking members 7 and the light emitting elements 3 are all arranged on a side surface of the planarization layer 15 away from the transistor array layers 12. Minimum distance from a side surface of the blocking member 7 in contact with the first substrate 1 to a side surface of the blocking member 7 facing away from the first substrate 1 is a sixth distance D6, and the first conductor 41 is provided on the side surface of the blocking member 7 facing away from the first substrate 1. Considering that the blocking member 7 is provided between the first conductor 41 and the first substrate 1, after the first conductor 41 is fabricated on the first substrate 1, minimum distance from the surface of the first conductor 41 facing away from the first substrate 1 to the surface of the blocking member 7 in contact with the first substrate 1 is the sum of the first distance D1 and the sixth distance D6. At this time, in order to avoid interference in the production of the first conductor 41 and the light emitting element 3, the sum of the first distance D1 and the sixth distance D6 should not be greater than the second distance D2, so as to facilitate the transfer process of the light emitting element 3.

For example, projection of the blocking member 7 on the first substrate 1 covers the projection of the first conductor 41 on the first substrate 1. By arranging the projection of the first conductor 41 on the first substrate 1 within the projection of the blocking member 7 on the first substrate 1, it is ensured that the first conductor 41 can be stably arranged on the blocking member 7, which improves reliability of the display panel 100.

In some embodiments, the first conductor 41 can reuse the blocking member 7, that is, materials of the first conductor 41 and the blocking member 7 can be molybdenum, titanium, aluminum, and titanium-aluminum-titanium composite layer materials. The first conductor 41 and the blocking member 7 can be integrally manufactured to simplify the manufacturing process of the display panel 100, so as to improve the manufacturing efficiency.

In the embodiments of the present disclosure, the light emitting element 3 includes an inorganic light-emitting diode (LED), which has the advantages of long life, high light efficiency, low radiation, and low power consumption. Since spectrum of the inorganic light-emitting diode is almost entirely concentrated in visible light band, its luminous efficiency is higher, and also its technological development is more mature. Specifically, the light emitting element 3 may be a Micro LED (micro Light-emitting diode) or a Mini-LED (small light-emitting diode). The Micro LED and Mini-LED have the advantages of small size, high luminous efficiency, and low energy consumption. Size of the Micro LED is less than 100 microns, for example, less than 50 microns, while size of Mini-LED is less than 200 microns, which can clearly display numbers and patterns in smaller display panels.

Figure 18:
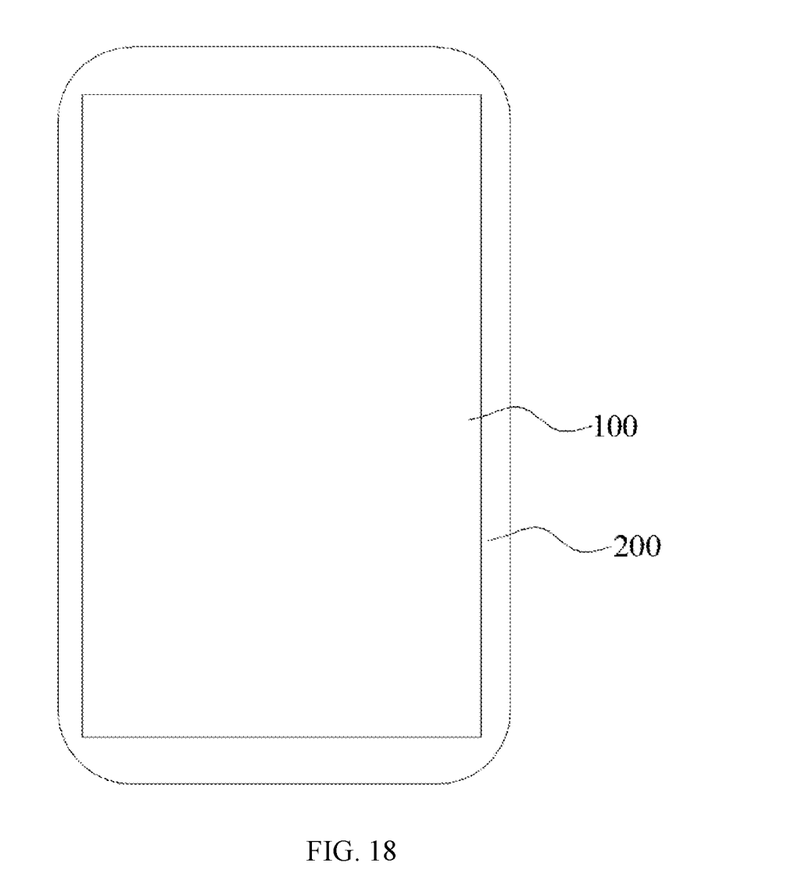
FIG. 18 is a top view of a display device according to another embodiment of the present disclosure.

The embodiments of the present disclosure also provide a display device 200. Referring to FIG. 18, the display device 200 includes the display panel 100 in the embodiments described above. The display device 200 provided by the embodiments of the present disclosure has the technical effect in the technical solution of the display panel 100 in any of the embodiments described above, and the explanation of the same or corresponding structure and terms as the embodiments described above will not be repeated herein.

The display device 200 provided by the embodiments of the present disclosure can be a mobile phone or any electronic product with display function, including but not limited to the following categories: a TV, a laptop, a desktop display, a tablet computer, a digital camera, a smart hand ring, smart glasses, an on-board display, a medical equipment, an industrial control equipment, a touch interactive terminal, etc. which is not particularly limited in the embodiments of the present disclosure.

The above are only some specific embodiments of the present disclosure. Those skilled in the art can clearly understand that, for the specific working processes of the systems, modules, and units described above, reference may be made to the corresponding processes in the foregoing method embodiments for the convenience and brevity of the description, which will not be repeated herein. It should be understood that the scope of the present disclosure is not limited hereto. Any person skilled in the art can easily conceive various equivalent modifications or substitutions within the technical scope disclosed in the present disclosure, and these modifications or substitutions should be within the scope of the present disclosure.

It should also be noted that the exemplary embodiments of the present disclosure describe some methods or systems based on a series of steps or devices. However, the present disclosure is not limited to the order of the above steps, that is, the steps may be performed in the order in the embodiments, or may be different from the order in the embodiments, or several steps may be performed at the same time.

What is claimed is:

1. A display panel comprising:
   a first substrate;
   a second substrate arranged opposite to the first substrate;
   a light emitting element located on a side of the first substrate facing towards the second substrate;
   a first conductor located on the side of the first substrate facing towards the second substrate; and
   a second conductor located on a side of the second substrate facing towards the first substrate,
   wherein the first conductor and the second conductor overlap, and the second conductor include a plurality of discretely arranged sub-members.

2. The display panel of claim 1,
   wherein the first conductor includes a first member distributed annularly along an outer peripheral side of the light emitting element.

3. The display panel of claim 2, further including:
   multiple light emitting elements and multiple first members,
   wherein an outer peripheral side of each light emitting element of the multiple light emitting elements corresponds to one first member of the multiple first members of the first conductor, and the multiple first members are electrically connected to each other.

4. The display panel of claim 1, wherein the first conductor is grounded.

5. The display panel of claim 1, wherein the first conductor includes a first surface facing towards the second substrate, and the light emitting element includes a second surface facing towards the second substrate, a distance between the first surface and the first substrate being smaller than a distance between the second surface and the first substrate.

6. The display panel of claim 1, wherein a distance between the first conductor and the second conductor is smaller than a distance between the light emitting element and the second substrate.

7. The display panel of claim 1, wherein a distance between the first conductor and the second conductor is greater than zero.

8. The display panel of claim 1,
   wherein the first conductor is in contact with the second conductor.

9. The display panel of claim 1, further comprising:
   a sub-member group including at least two sub-members,
   wherein a projection of the sub-member group on the first substrate is located around at least one light emitting element.

10. The display panel of claim 9, wherein the sub-members in the sub-member group are arranged symmetrically.

11. The display panel of claim 9, wherein the projection of the sub-member group on the first substrate is located around at least two light emitting elements.

12. The display panel of claim 1, wherein the second conductor includes a tip end facing towards the first substrate.

13. The display panel of claim 1, further comprising:
    a black matrix layer located between the second substrate and the second conductor,
    wherein the black matrix layer and the second conductor overlap.

14. The display panel of claim 13, wherein a material of the black matrix layer includes a black conductive material.

15. The display panel of claim 1, wherein:
    a material of the first conductor includes a metal; and
    a material of the second conductor includes a metal or a black conductive material.

16. The display panel of claim 1, wherein the first substrate includes a base substrate and a transistor array layer located on a side of the base substrate and between the base substrate and the light emitting element.

17. The display panel of claim 1, further comprising:
    a blocking member located between the first substrate and the first conductor,
    wherein the blocking member is located between adjacent light emitting elements.

18. A display device comprising:
    a display panel including:
      a first substrate;
      a second substrate arranged opposite to the first substrate;
      a light emitting element located on a side of the first substrate facing towards the second substrate;
      a first conductor located on the side of the first substrate facing towards the second substrate; and
      a second conductor located on a side of the second substrate facing towards the first substrate,
      wherein the first conductor and the second conductor overlap, and the second conductor include a plurality of discretely arranged sub-members.

* * * * *